United States Patent [19]

Tamegaya

[11] Patent Number: 4,967,106
[45] Date of Patent: Oct. 30, 1990

[54] EMITTER-COUPLED LOGIC CIRCUIT

[75] Inventor: Yukio Tamegaya, Tokyo, Japan

[73] Assignee: NEC Corporation, Japan

[21] Appl. No.: 389,537

[22] Filed: Aug. 4, 1989

[30] Foreign Application Priority Data

Aug. 6, 1988 [JP] Japan .................................. 63-196478

[51] Int. Cl.$^5$ ................. H03K 19/013; H03K 19/086; H03K 17/04
[52] U.S. Cl. .................................... 307/455; 307/443; 307/363
[58] Field of Search ................ 307/455, 475, 443, 542, 307/296.1, 289, 290, 291, 355, 356, 358, 359, 362, 363

[56] References Cited

U.S. PATENT DOCUMENTS

| | | | |
|---|---|---|---|
| 3,573,489 | 4/1971 | Sramek .................................. | 307/455 |
| 4,585,957 | 4/1986 | Ooms .................................... | 307/455 |
| 4,695,749 | 9/1987 | Lam ...................................... | 307/454 X |
| 4,736,124 | 4/1988 | McFarland, Jr. ..................... | 307/455 |
| 4,757,216 | 7/1988 | Tanahashi ............................ | 307/455 |
| 4,771,190 | 9/1988 | Umeki .................................. | 307/455 |

*Primary Examiner*—Stanley D. Miller
*Assistant Examiner*—David R. Bertelson
*Attorney, Agent, or Firm*—Laff, Whitesel, Conte & Saret

[57] ABSTRACT

An emitter-coupled logic circuit, including first to fourth n-p-n transistors, the first transistor having its base connected to a first input signal source and its collector connected to a first supply voltage source, the second transistor having its base connected to a second input signal source and its collector connected to the first supply voltage source, the first and second transistors having their emitters connected to a second supply voltage source via a constant current source, an n-p-n transistor type emitter-follower circuit having an input terminal connected to the collector of the first transistor and its collector connected to the first supply voltage source, a load element connected between the first supply voltage source and the collector of the first or second transistor, the third transistor having its base connected to a reference voltage source and its collector connected to the first supply voltage source, the fourth transistor having its base connected to the base of the first transistor, its collector connected to the emitter of the third transistor and its emitter connected to the second supply voltage source, and a p-n-p transistor type emitter-follower circuit having an input terminal connected to a node between the emitter of the third transistor and the collector of the fourth transistor, the n-p-n and p-n-p transistor type emitter-follower circuits having output terminals connected together to provide an output terminal of the logic circuit.

16 Claims, 3 Drawing Sheets

EMITTER-COUPLED LOGIC CIRCUIT

FIELD OF THE INVENTION

The present invention relates to semiconductor logic gate circuits and, more particularly, to an emitter-coupled logic circuit.

BACKGROUND OF THE INVENTION

An emitter-coupled logic circuit is generally composed of a differential amplifier stage and an emitter-follower stage which are connected in parallel between a high-level supply voltage source and a low-level supply voltage source and in series between signal input and output terminals of the emitter-coupled logic circuit. The differential amplifier stage in turn is made up essentially of a pair of n-p-n transistors connected in parallel between the high-level and low-level supply voltage sources. One of the two n-p-n transistors is to be turned on responsive to an input signal of high level and the other of the transistors is to be turned on responsive to an input signal of low level. On the other hand, the emitter-follower stage of the emitter-coupled logic circuit includes a series combination of an n-p-n transistor and a constant current source network connected between the high-level and low-level supply voltage sources. The n-p-n transistor thus forming part of the emitter-follower stage is activated either directly by a voltage supplied from the high-level supply voltage source or by a voltage supplied through the differential amplifier stage to produce an output signal of low or high level responsive to the input voltage of high or low level, respectively.

During transition of the output signal from the low level to high level, the n-p-n transistor of the emitter-follower stage receives charges at its emitter from a load capacitor connected in parallel with the n-p-n to form an emitter-follower network. For the transition of the output signal from the high level to low level, the load capacitor receives charges through the constant current source network until the capacitor is fully charged.

The constant current source network used in the emitter-follower stage is usually arranged such that the current to be supplied therefrom is far smaller than the emitter current of the associated transistor. For this reason, the high-to-low transition time of the output voltage of the emitter-coupled logic circuit is far longer than the low-to-high transition time of the output signal. Such a long high-to-low transition time of the output signal is apparently objectionable for speeding up the operation of the emitter-coupled logic circuit.

SUMMARY OF THE INVENTION

It is, accordingly, an important object of the present invention to provide an improved emitter-coupled logic circuit having a significantly shortened high-to-low transition time of the output voltage.

It is thus another important object of the present invention to provide an improved emitter-coupled logic circuit capable of operating at a significantly fast speed.

In accordance with a first outstanding aspect of the present invention, there is provided an emitter-coupled logic circuit, comprising (a) a first bipolar transistor of a first type having its base electrically connected to a first input signal source ($V_{IN}$) and its collector electrically connected to a first supply voltage source network, (b) a second bipolar transistor of the first type having its base electrically connected to a second input signal source ($V_{REF1}$) and its collector electrically connected to the first supply voltage source, (c) a constant current source network through which the first and second bipolar transistors have their respective emitters electrically connected in parallel to a second supply voltage source, (d) a first emitter-follower circuit having an input terminal electrically connected to the collector of the first bipolar transistor and its collector electrically connected to the first supply voltage source network, the bipolar transistor type emitter-follower circuit further having an output terminal, (e) a load element electrically connected between the first supply voltage source and the collector of one of the first bipolar transistor and the second bipolar transistor, (f) a third bipolar transistor of the first type having its base electrically connected to a reference voltage source and its collector electrically connected to the first supply voltage source, (g) a fourth bipolar transistor of the first type having its base electrically connected to the base of the first bipolar transistor, its collector electrically connected to the emitter of the third bipolar transistor and its emitter electrically connected in parallel with the the emitters of the first and second bipolar transistors to the second supply voltage source, and (h) a second emitter-follower circuit having an input terminal electrically connected a junction between the emitter of the third bipolar transistor and the collector of the fourth bipolar transistor, the second emitter-follower circuit further having an output terminal, (i) the output terminal of the first emitter-follower circuit and the output terminal of the second emitter-follower circuit being electrically connected together to provide an output terminal of the emitter-coupled logic circuit.

In an emitter-coupled logic circuit thus constructed and arranged in accordance with the first outstanding aspect of the present invention, the first emitter-follower circuit may comprise a fifth bipolar transistor of the first type and a load capacitor which are electrically connected in parallel between the first supply voltage source and the bipolar transistor type emitter follower circuit, the fifth transistor having its collector electrically connected to the first supply voltage source and to one plate of the load capacitor, its emitter electrically connected to the second emitter follower circuit and to the other of the load capacitor, and its base electrically connected to the collector of the first bipolar transistor. In this instance, the second emitter-follower circuit may comprise a bipolar transistor having its collector electrically connected to the second supply voltage source, its emitter electrically connected to the emitter of the fifth bipolar transistor, and its base electrically connected to a node between the emitter of the third bipolar transistor and the collector of the fourth bipolar transistor.

An an emitter-coupled logic circuit according to the first outstanding aspect of the present invention may further comprise (j) an input/output matching emitter-follower network through which the first bipolar transistor is responsive to the first input signal source for providing matching between the input and output signals levels of the emitter-coupled logic circuit. In this instance, the input/output matching emitter-follower network may comprise a seventh bipolar transistor of the first type having its base electrically connected to the first input signal source its collector electrically connected to the first supply voltage source, and its emitter electrically connected through a constant current source network to the second supply voltage source.

In accordance with a second outstanding aspect of the present invention, there is provided an emitter-coupled logic circuit, comprising (a) a first n-p-n transistor having its base electrically connected to a first input signal source and its collector electrically connected to a first supply voltage source, (b) a second n-p-n transistor having its base electrically connected to a second input signal source and its collector electrically connected to the first supply voltage source, (c) a constant current source network through which the first and second n-p-n transistors have their respective emitters electrically connected in parallel to a second supply voltage source, (d) an n-p-n transistor type emitter-follower circuit having an input terminal electrically connected to the collector of the first n-p-n transistor and its collector electrically connected to the first supply voltage source, the n-p-n transistor type emitter-follower circuit further having an output terminal, (e) a load element electrically connected between the first supply voltage source and the collector of one of the first n-p-n transistor and the second n-p-n transistor, (f) a third n-p-n transistor having its base electrically connected to a reference voltage source and its collector electrically connected to the first supply voltage source, (g) a fourth n-p-n transistor having its base electrically connected to the base of the first n-p-n transistor, its collector electrically connected to the emitter of the third n-p-n transistor and its emitter electrically connected in parallel with the the emitters of the first and second n-p-n transistors to the second supply voltage source, and (h) a p-n-p transistor type emitter-follower circuit having an input terminal electrically connected a junction between the emitter of the third n-p-n transistor and the collector of the fourth n-p-n transistor, the p-n-p transistor type emitter-follower circuit further having an output terminal, (i) the output terminal of the n-p-n transistor type emitter-follower circuit and the output terminal of the p-n-p transistor type emitter-follower circuit being electrically connected together to provide an output terminal of the emitter-coupled logic circuit.

In an emitter-coupled logic circuit thus constructed and arranged in accordance with the second outstanding aspect of the present invention, the n-p-n transistor type emitter-follower circuit may comprise a fifth n-p-n transistor and a load capacitor which are electrically connected in parallel between the first supply voltage source and the p-n-p transistor type emitter follower circuit, the fifth transistor having its collector electrically connected to the first supply voltage source and to one plate of the load capacitor, its emitter electrically connected to the p-n-p transistor type emitter follower circuit and to the other of the load capacitor, and its base electrically connected to the collector of the first n-p-n transistor. In this instance, the p-n-p transistor type emitter-follower circuit may comprise a p-n-p transistor having its collector electrically connected to the second supply voltage source, its emitter electrically connected to the emitter of the fifth n-p-n transistor, and its base electrically connected to a node between the emitter of the third n-p-n transistor and the collector of the fourth n-p-n transistor.

An emitter-coupled logic circuit according to the second outstanding aspect of the present invention may further comprise (j) an input/output matching emitter-follower network through which the first n-p-n transistor is responsive to the first input signal source for providing matching between the input and output signals levels of the emitter-coupled logic circuit. This input-/output matching emitter-follower network may comprise a seventh n-p-n transistor having its base electrically connected to the first input signal source, its collector electrically connected to the first supply voltage source, and its emitter electrically connected through a constant current source network to the second supply voltage source.

In accordance with a third outstanding aspect of the present invention, there is provided an emitter-coupled logic circuit, comprising (a) a first bipolar transistor having a control terminal electrically connected to an input signal source, a current path electrically connected at one end thereof to a first supply voltage source and at the other end thereof to a second supply voltage source, (b) a first constant current source network through which the first bipolar transistor has its current path electrically connected to the second supply voltage source, (c) a second bipolar transistor of a first type having a control terminal electrically connected to the current path of the first bipolar transistor and a current path electrically connected to the first supply voltage source through a load element, (d) a third bipolar transistor of the first type having a control terminal electrically connected to a first reference signal source and a current path electrically connected to the first supply voltage source, (e) a fourth bipolar transistor of the first type having a control terminal electrically connected to a second reference voltage source and a current path electrically connected at one end thereof to the first supply voltage source, (f) a fifth bipolar transistor of the first type having a control terminal electrically connected to the current path of the first bipolar transistor and a current path electrically connected at one end thereof to the other end of the current path of the fourth bipolar transistor and at the other end thereof to the second supply voltage source, (g) a second constant current source network through which the second, third and fifth bipolar transistors have their respective current paths electrically connected in parallel to the second supply voltage source, (h) a sixth bipolar transistor of the first type having a current path electrically connected at one end thereof to the first supply voltage source and a current path providing at one end thereof a signal output terminal of the emitter-coupled logic circuit and electrically connected at the other end thereof to a junction between the load element and the current path of the second bipolar transistor, (i) a load capacitor electrically connected across the current path of the sixth bipolar transistor, and (j) a seventh bipolar transistor of a second type opposite to the first type, the seventh bipolar transistor having a current path electrically connected at one end thereof to the second supply voltage source and at the other end thereof to the current path of the sixth bipolar transistor and providing the signal output terminal, and a control terminal electrically connected to a node between the current path of the fourth bipolar transistor and the current path of the fifth bipolar transistor.

In accordance with a fourth outstanding aspect of the present invention, there is provided an emitter-coupled logic circuit, comprising (a) a first bipolar transistor having a control terminal electrically connected to an input signal source, a current path electrically connected at one end thereof to a first supply voltage source and at the other end thereof to a second supply voltage source, (b) a first constant current source network through which the first bipolar transistor has its current path electrically connected to the second supply voltage source, (c) a second bipolar transistor of a first type having a control terminal electrically connected to the current path of the first bipolar transistor and a current path electrically connected to the first supply voltage source, (d) a third bipolar transistor of the first type having a control terminal electrically connected to a first reference signal source, a current path electrically connected to the first supply voltage source through a load element, (e) a fourth bipolar transistor of the first type having a control terminal electrically connected to a second reference voltage source and a current path electrically connected at one end thereof to the first supply voltage source, (f) a fifth bipolar transistor of the first type having a control terminal electrically connected to the current path of the first bipolar transistor and a current path electrically connected at one end thereof to the other end of the current path of the fourth bipolar transistor and at the other end thereof to the second supply voltage source, (g) a second constant current source network through which the second, third and fifth bipolar transistors have their respective current paths electrically connected in parallel to the second supply voltage source, (h) a sixth bipolar transistor of the first type having a current path electrically connected at one end thereof to the first supply voltage source and a current path providing at one end thereof thereof a signal output terminal of the emitter-coupled logic circuit and electrically connected at the other end thereof to a junction between the load element and the current path of the third bipolar transistor, (i) a load capacitor electrically connected across the current path of the sixth bipolar transistor, and (j) a seventh bipolar transistor of a second type opposite to the first type, the seventh bipolar transistor having a current path electrically connected at one end thereof to the second supply voltage source and at the other end thereof to the current path of the sixth bipolar transistor and providing the signal output terminal, and a control terminal electrically connected to a node between the current path of the fourth bipolar transistor and the current path of the fifth bipolar transistor.

BRIEF DESCRIPTION OF THE ACCOMPANYING DRAWINGS

The drawbacks of a prior-art emitter-coupled logic circuit of the nature to which the present invention appertains and the features and advantages of an emitter-coupled logic circuit according to the present invention over such a prior-art emitter-coupled logic circuit will be more clearly understood from the following description taken in conjunction with the accompanying drawings in which like reference numerals and characters designate similar or corresponding circuit stages and element and in which:

FIG. 1 is a schematic diagram showing the circuit arrangement of a typical example of a known emitter-coupled logic circuit formed to implement a logic inverter circuit;

FIG. 2 is a schematic diagram showing the circuit arrangement of a first preferred embodiment of an emitter-coupled logic circuit according to the present invention, the emitter-coupled logic circuit herein shown being constructed and arranged to implement a logic inverter circuit; and FIG. 3 is a schematic diagram showing the circuit arrangement of a second preferred embodiment of an emitter-coupled logic circuit according to the present invention, the emitter-coupled logic circuit herein shown being constructed and arranged to implement a buffer circuit.

DETAILED DESCRIPTION OF THE PRIOR ART

Description will be hereinafter made with reference to FIG. 1 to more clearly show the drawbacks of a prior-art emitter-coupled logic circuit.

Figure 1:
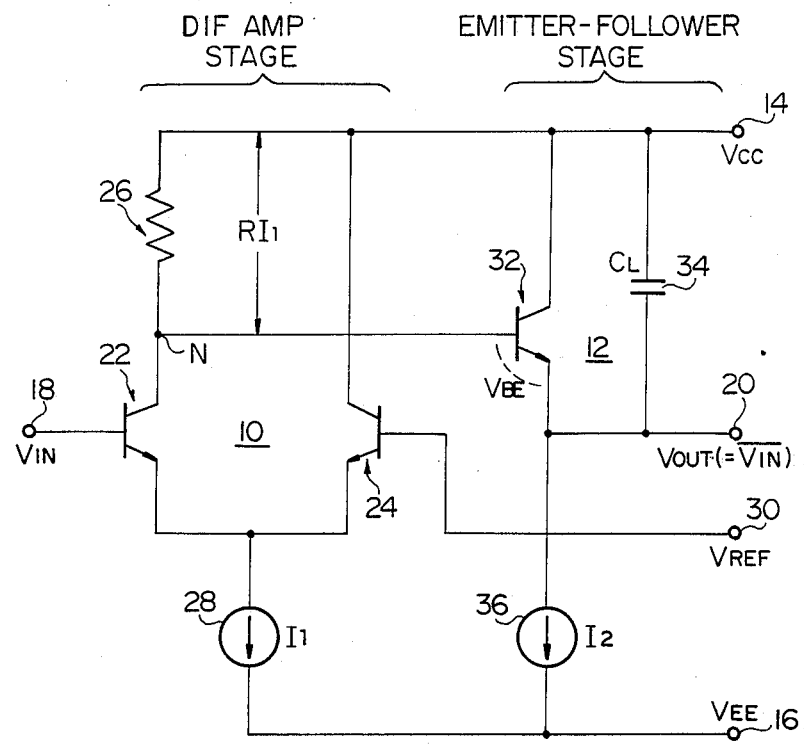

In FIG. 1 of the accompanying drawings is shown a conventional emitter-coupled logic circuit which largely consists of a differential amplifier stage 10 and an emitter-follower stage 12 which are connected in parallel between a bus line leading from a high-level supply voltage source 14 and a bus line leading from a low-level supply voltage source 16. As is customary in the art, the high-level supply voltage source 14 is adapted to supply a high-level supply voltage $V_{CC}$ of, typically, ground level and the low-level supply voltage source 16 is adapted to supply a low-level supply voltage $V_{EE}$ of, typically, $-5.2$ volts. The differential amplifier stage 10 and emitter-follower stage 12 are further connected in series between a signal input terminal 18 and a signal output terminal 20. At the signal input terminal 18 is to appear a binary input signal $V_{IN}$ having a high level of, typically, $-0.75$ volt and a low level of, typically, $-1.55$ volt, as is also customary in the art.

The prior-art emitter-coupled logic circuit herein shown is constructed and arranged to implement a logic inverter circuit Thus, a binary output signal $V_{OUT}$ having a low level of $-1.55$ volt or a high level of $-0.75$ volt is to appear at the signal output terminal 20 in response to the binary input signal $V_{IN}$ of the high level of $-0.75$ volt or the low level of $-1.55$ volt, respectively, as will be described in more detail.

The differential amplifier stage 10 connected between the high-level and low-level supply voltage sources $V_{CC}$ and $V_{EE}$ includes transistors 22 and 24 each of the n-p-n type. The n-p-n transistor 22 has its collector connected through a resistor 26 to the bus line leading from the high-level supply voltage source 14, while the n-p-n transistor 24 has its collector connected directly to the bus line leading from the high-level supply voltage source 14. The n-p-n transistors 22 and 24 have their respective emitters connected in parallel through a constant current source network 28 to the bus line leading from the low-level supply voltage source 16. The constant current source network 28 is adapted to produce a constant current $I_1$ through the series combination of the n-p-n transistor 22 and resistor 26 or through the n-p-n transistor 24.

The n-p-n transistor 22 has its base connected to the signal input terminal 18 and is thus activated by the binary input signal $V_{IN}$ of high or low level supplied from an external circuit (not shown). The n-p-n transistor 24 has its base connected to a reference voltage source 30. From the reference voltage source 30 is to be supplied a reference voltage $V_{REF}$ of a predetermined level intervening between the high ($-0.75$ V) and low ($-1.55$ V) levels of the input signal $V_{IN}$ to be supplied to the base of the n-p-n transistor 22. The reference voltage $V_{REF}$ thus supplied from the reference voltage source 30 to the base of the transistor 24 is typically of the level of $-1.15$ volt.

On the other hand, the emitter-follower stage 12 of the prior-art emitter-coupled logic circuit includes an n-p-n transistor 32 and a load capacitor 34. The n-p-n transistor 32 has its collector connected directly to the bus line leading from the high-level supply voltage source 14 and its emitter connected to the bus line leading from the low-level supply voltage source 16 through a constant current source network 36. The emitter of the n-p-n transistor 32 is further connected to the signal output terminal 20 of the emitter-coupled logic circuit. The load capacitor 34, having a capacitance $C_L$ as shown, has one of its plates connected to the collector of the transistor 32 through the bus line leading from the high-level supply voltage source 14 and the other plate connected to the emitter of the transistor 32 as shown. The parallel combination of the n-p-n transistor 32 and load capacitor 34 thus connected between the bus lines leading from the high-level and low-level supply voltage sources 14 and 16 respectively, forms an emitter-follower network in the shown prior-art emitter-coupled logic circuit. The constant current source network 26 is adapted to produce a constant current $I_2$ through the current path of the n-p-n transistor 32 thus forming part of the emitter-follower.

Furthermore, the n-p-n transistor 32 forming part of the emitter-follower stage 12 has its base connected to a node N between the resistor 26 and the collector of the n-p-n transistor 22 of the differential amplifier stage 10 and is thus activated by the voltage $V_{CC}$-$RI_1$ when the transistor 22 is turned on, wherein R is the resistance value of the resistor 26 and thus the value $V_{CC}$-$RI_1$ is indicative of the voltage drop across the resistor 26.

In operation, when there is an input signal $V_{IN}$ of high level appearing at the signal input terminal 18 of the emitter-coupled logic circuit thus constructed and arranged, the n-p-n transistor 22 of the differential amplifier stage 10 is activated to turn on and accordingly the n-p-n transistor 24 is turned off. The n-p-n transistor 24 is de-activated responsive to the reference voltage $V_{REF}$ lower than the high-level input signal $V_{IN}$ currently supplied to the n-p-n transistor 22. The n-p-n transistor 22 being thus turned on, a collector current $I_1$ flows through the current path of the n-p-n transistor 22. Across the resistor 26 is accordingly produced a voltage drop $RI_1$ so that the n-p-n transistor 32 of the emitter-follower stage 12 is activated by the voltage $V_{CC}$-$RI_1$. Considering that the n-p-n transistor 32 forms part of an emitter-follower network so that there is a base-emitter voltage $V_{BE}$ produced between the base and emitter of the n-p-n transistor 32, the output signal $V_{OUT}$ to appear at the signal output terminal 20 is given by the equation:

$$V_{OUT} = V_{CC} - (RI_1 + V_{BE}) \quad \text{Eq. 1}$$

Where the high-level supply voltage $V_{CC}$ of ground level is used and if the voltage drop $RI_1$ across the resistor 26 is selected at 0.8 volt and the base-emitter voltage $V_{BE}$ of the n-p-n transistor 32 selected at 0.75 volt, the output signal $V_{OUT}$ which appears at the signal output terminal 20 of the emitter-coupled logic circuit is given by $$V_{OUT} = 0 - (0.8 + 0.75) = -1.55 \text{ volt.}$$

This value of the output signal $V_{OUT}$ corresponds to the low level of the input signal $V_{IN}$ supplied to the emitter-coupled logic circuit, which means that the emitter-coupled logic circuit under consideration acts as a logic inverter circuit.

On the other hand, when there is an input signal $V_{IN}$ of low level appearing at the signal input terminal 18 of the emitter-coupled logic circuit, the n-p-n transistor of the differential amplifier stage 10 is turned off and accordingly the n-p-n transistor 24 of the stage 10 is activated to turn on by the reference voltage $V_{REF}$ applied to the base of the transistor 24. The n-p-n transistor 24 being thus turned on, there is little collector current $I_1$ flowing through the current path of the n-p-n transistor 22. The n-p-n transistor 32 of the emitter-follower stage 12 is thus activated by the high-level supply voltage $V_{CC}$ from the high-level supply voltage source 14 so that the output signal $V_{OUT}$ to appear at the signal output terminal 20 is given by the equation:

$$V_{OUT} = V_{CC} - V_{BE} \quad \text{Eq. 2}$$

Where the high-level supply voltage $V_{CC}$ of ground level is used and if the base-emitter voltage $V_{BE}$ of the n-p-n transistor 32 is selected at 0.75 volt as above assumed, the output signal $V_{OUT}$ which appears at the signal output terminal 20 of the emitter-coupled logic circuit is given by $$V_{OUT} = 0 - 0.75 = -0.75 \text{ volt.}$$

This value of the output signal $V_{OUT}$ corresponds to the high level of the input signal $V_{IN}$ supplied to the emitter-coupled logic circuit, which again means that the emitter-coupled logic circuit under consideration acts as a logic inverter circuit.

As will have been understood from the foregoing description, the prior-art emitter-coupled logic circuit shown in FIG. 1 acts as a logic inverter circuit having a logical swing of the value $RI_1$ between the low and high levels of the output signal $V_{OUT}$.

During transition of the output signal $V_{OUT}$ from the low level to high level in the prior-art emitter-coupled logic circuit of this nature, the load capacitor 34 supplies charges to the emitter of the associated n-p-n transistor 32 until the output signal $V_{OUT}$ reaches the high level of, for example, $-0.75$ volt. On the other hand, for the transition of the output signal $V_{OUT}$ from the high level to low level, the load capacitor 34 receives charges from the emitter of the transistor 32 through the constant current source network 36 until the capacitor 34 is fully charged and the output signal $V_{OUT}$ reaches the low level of, for example, $-1.55$ volt.

As well known in the art, the constant current source network 36 used in the emitter-follower stage 12 is usually arranged to supply a current $I_2$ which is far smaller than the emitter current of the n-p-n transistor 32. For this reason, the fall-time of the output signal $V_{OUT}$, that is, the period of time required for the transition of the output signal $V_{OUT}$ from the high level to low level is far longer than the rise-time of the output signal $V_{OUT}$, that is, the period of time required for the transition of the output signal $V_{OUT}$ from the low level to high level. Such a long high-to-low transition time of the output signal is objectionable for the high-speed operation of an emitter-coupled logic circuit as has been noted at the outset of the description.

PREFERRED EMBODIMENTS OF THE INVENTION

Description will be hereinafter made with reference to FIGS. 2 and 3 in regard to preferred embodiments of an emitter-coupled logic circuit according to the present invention.

First Preferred Embodiment

Figure 2:
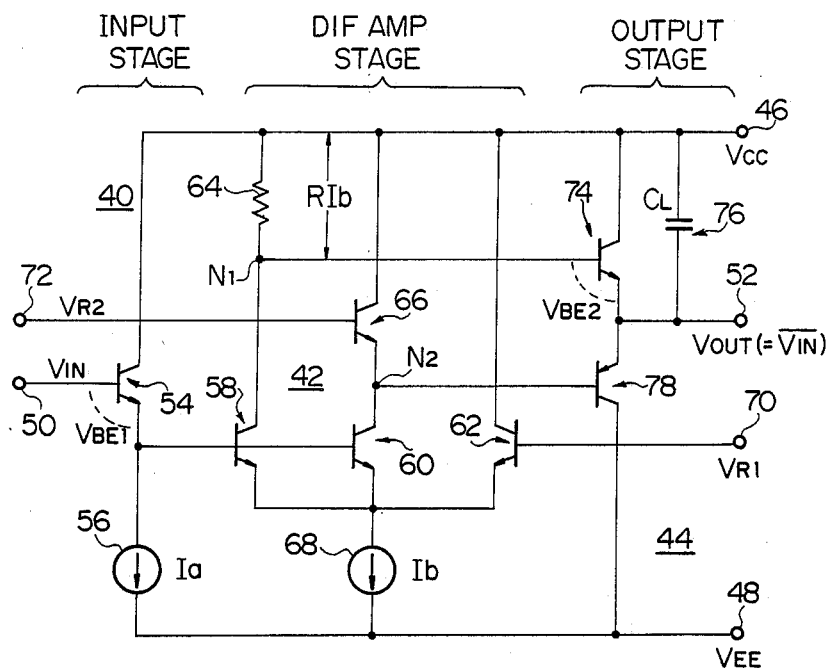

FIG. 2 shows a first preferred embodiment of an emitter-coupled logic circuit according to the present invention.

As illustrated in FIG. 2, the first preferred embodiment of the present invention largely comprises an input stage 40, a differential amplifier stage 42 and an output stage 44 which are connected in parallel between a bus line leading from a high-level supply voltage source 46 and a bus line leading from a low-level supply voltage source 48. The high-level supply voltage source 46 is adapted to supply a high-level supply voltage $V_{CC}$ of, typically, ground level and the low-level supply voltage source 48 is adapted to supply a low-level supply voltage $V_{EE}$ of, typically, $-5.2$ volts. The input stage 40, differential amplifier stage 42 and output stage 44 are further connected in series between a signal input terminal 50 and a signal output terminal 52. At the signal input terminal 50 is to appear a binary input signal $V_{IN}$ having a high level $V_{IN(H)}$ of, typically, $-0.75$ volt and a low level $V_{IN(L)}$ of, typically, $-1.55$ volt, as is also customary in the art.

The embodiment of an emitter-coupled logic circuit according to the present invention as herein shown is also constructed to implement a logic inverter circuit. Thus, a binary output signal $V_{OUT}$ having a low level of $-1.55$ volt or a high level of $-0.75$ volt is to appear at the signal output terminal 52 in response to the binary input signal $V_{IN}$ of the high level $V_{IN(H)}$ of $-0.75$ volt or the low level $V_{IN(L)}$ of $-1.55$ volt, respectively, as will be described in more detail.

The input stage 40 of the emitter-coupled logic circuit comprises a transistor 54 of the n-p-n type and a constant current source network 56 connected in series between the bus lines leading from and to the high-level and low-level supply voltage sources $V_{CC}$ and $V_{EE}$, respectively. The n-p-n transistor 54 has its collector connected to the bus line leading from the high-level supply voltage source 46 and its emitter connected through the constant current source network 56 to the bus line leading from the low-level supply voltage source 48. The n-p-n transistor 54 further has its base connected to the signal input terminal 50 and is thus activated by the binary input signal $V_{IN}$ of high or low level $V_{IN(H)}$ or $V_{IN(L)}$ supplied from an external circuit (not shown). The constant current source network 56 is adapted to produce a constant current $I_a$ through the current path of the n-p-n transistor 54.

On the other hand, the differential amplifier stage 42 of the emitter-coupled logic circuit is also connected between the high-level and low-level supply voltage sources $V_{CC}$ and $V_{EE}$ and comprises transistors 58, 60 and 62 each of the n-p-n type. The n-p-n transistor 58 has its collector connected through a resistor 64 to the bus line leading from the high-level supply voltage source 46. The n-p-n transistor 60 has its collector connected through an n-p-n transistor 66 to the bus line leading from the high-level supply voltage source 46. The n-p-n transistor 62 has its collector connected directly to the bus line leading from the high-level supply voltage source 46. The n-p-n transistors 58, 60 and 62 have their respective emitters connected in parallel through a constant current source network 68 to the bus line leading from the low-level supply voltage source 48. The constant current source network 68 is adapted to produce a constant current $I_b$ through the series combination of the n-p-n transistor 58 and resistor 64, through the series combination of the n-p-n transistors 60 and 66, or through the n-p-n transistor 62.

The n-p-n transistor 58 has its base connected to the emitter of the n-p-n transistor 54 and is thus activated by a voltage $V_{CC}$-$V_{BE1}$ when the transistor 54 is turned on, wherein $V_{BE1}$ represents the base-emitter voltage of the transistor 54. The n-p-n transistor 60 has its base also connected to the emitter of the n-p-n transistor 54 and is activated by the voltage $V_{CC}$-$V_{BE1}$ when the transistor 54 is turned on.

The n-p-n transistor 62 has its base connected to a first reference voltage source 70. From the first reference voltage source 70 is to be supplied a first reference voltage $V_{REF1}$ of a predetermined level which is given in terms of the high and low levels $V_{IN(H)}$ and $V_{IN(L)}$ and the base-emitter voltage $V_{BE1}$ of the n-p-n transistor 54, as $$V_{REF1}=[V_{IN(H)}+V_{IN(L)}]/2-V_{BE1}.$$

The n-p-n transistor 66 has its base connected to a second reference voltage source 72. From the first reference voltage F source 72 is to be supplied a second reference voltage $V_{REF2}$ of a predetermined level equal to the low level $V_{IN(L)}$ of the input signal $V_{IN}$ applied to the base of the n-p-n transistor 54 The reference voltage $V_{REF2}$ thus supplied from the second reference voltage source 72 to the base of the transistor 66 is typically of the level of $-1.55$ volt.

On the other hand, the output stage 44 of the emitter-coupled logic circuit embodying the present invention comprises an n-p-n transistor 74 and a load capacitor 76. The n-p-n transistor 74 has its collector connected directly to the bus line leading from the high-level supply voltage source 46 and its emitter connected to the bus line leading from the low-level supply voltage source 48 through a transistor 78 of the p-n-p type. The emitter of the n-p-n transistor 74 is further connected to the signal output terminal 52 of the emitter-coupled logic circuit. The load capacitor 76, having a capacitance $C_L$ as shown, has one of its plates connected to the collector of the n-p-n transistor 74 through the bus line leading from the high-level supply voltage source 46 and the other plate connected to the emitter of the transistor 74 as shown. The combination of the n-p-n transistor 74 and load capacitor 76 thus connected between the bus line leading from the high-level supply voltage source 46 and the bus line leading from the low-level supply voltage source 48 forms an n-p-n transistor type emitter-follower network in the emitter-coupled logic circuit herein shown.

The n-p-n transistor 74 further has its base connected to a node $N_1$ between the resistor 64 and the collector of the n-p-n transistor 58 of the differential amplifier stage 42. Thus, the n-p-n transistor type emitter-follower network implemented by the parallel combination of the transistor 74 and load capacitor 76 has an input terminal connected to the collector of the n-p-n transistor 58. The transistor 74 forming part of such an emitter-follower network is activated by the voltage $V_{CC}$-$RI_b$ when the transistor 58 is turned on, wherein R is the resistance value of the resistor 64 and thus the value $V_{CC}$-$RI_b$ is indicative of the voltage drop across the resistor 64.

Furthermore, the p-n-p transistor 78 forming part of the output stage 44 has its emitter connected to the emitter of the n-p-n transistor 74 and to the output signal $V_{OUT}$ and its collector connected to the bus line leading from the low-level supply voltage source 48. The p-n-p transistor 78 having the collector thus connected to the low-level supply voltage source 48 forms a p-n-p transistor type emitter-follower network in the shown emitter-coupled logic circuit. This p-n-p transistor type emitter-follower network has an input terminal connected to a node $N_2$ between the collector of the n-p-n transistor 60 and the emitter of the n-p-n transistor 66. Thus, the p-n-p transistor 78 forming the p-n-p transistor type emitter-follower network further has its base connected to the node $N_2$ between the collector of the n-p-n transistor 60 and the emitter of the n-p-n transistor 66 of the differential amplifier stage 42.

In the emitter-coupled logic circuit constructed as hereinbefore described, the input stage 40 composed of the series combination of the n-p-n transistor 54 and the constant current source network 56 forms an emitter-follower network. This emitter-follower network provides matching between the input and output signals levels of the emitter-coupled logic circuit. Furthermore, the series combination of the n-p-n transistor 74 and the p-n-p transistor 78 forming part of the output stage 44 provides a complementary push-pull circuit which is adapted to produce as the output signal $V_{OUT}$ of the emitter-coupled logic circuit either the voltage that appears at the collector of the n-p-n transistor 58 or the voltage that appears at the collector of the n-p-n transistor 60 of the differential amplifier stage 42 depending on the relationship between the potential at the node $N_1$ between the transistor 58 and the resistor 64 and the potential at the node $N_2$ between the transistors 60 and 66.

In operation, when there is an input signal $V_{IN}$ of low level appearing at the signal input terminal 50 of the emitter-coupled logic circuit thus constructed, the n-p-n transistor 54 of the input stage 40 is turned off. Each of the n-p-n transistors 58 and 60 of the differential amplifier stage 42 is thus also turned off and the n-p-n transistor 62 of the differential amplifier stage 42 is activated to turn on by the first reference volta $V_{REF1}$ from the first reference voltage source 70. The n-p-n transistor 62 being turned on, there is little collector current $I_b$ flowing through the current path of the n-p-n transistor 58 and the current path of the n-p-n transistor 60. In the absence of a collector current flowing through the n-p-n transistor 60, there is substantially no current allowed to flow through the current path of the n-p-n transistor 66, with the result that the p-n-p transistor 78 remains in the de-activated state. It therefore follows that the n-p-n transistor 74 of the output stage 44 is activated by a voltage close to the high-level supply voltage $V_{CC}$ from the high-level supply voltage source 46. Under these conditions, the load capacitor 76 supplies charges to the emitter of the associated n-p-n transistor 74 so that the output signal $V_{OUT}$ appearing at the signal output terminal 52 rapidly rises to a high level given by the equation:

$$V_{OUT} = V_{CC} - V_{BE2} \qquad \text{Eq. 3}$$

wherein $V_{BE2}$ represents the base-emitter voltage of the n-p-n transistor 74.

Where the high-level supply voltage $V_{CC}$ of ground level is used and if the base-emitter voltage $V_{BE2}$ of the n-p-n transistor 74 is selected at 0.75 volt as above assumed, the output signal $V_{OUT}$ which appears at the signal output terminal 52 of the emitter-coupled logic circuit becomes 31 0.75 volt. This value of the output signal $V_{OUT}$ corresponds to the high level $V_{IN(H)}$ of the input signal $V_{IN}$ supplied to the emitter-coupled logic circuit, which means that the emitter-coupled logic circuit under consideration acts as a logic inverter circuit.

On the other hand, when there is an input signal $V_{IN}$ of high level appearing at the signal input terminal 50 of the emitter-coupled logic circuit, the n-p-n transistor 54 of the input stage 40 is activated to turn on so that each of the n-p-n transistors 58 and 60 of the differential amplifier stage 42 is also activated to turn on and the n-p-n transistor 62 of the differential amplifier stage 42 is turned off. The n-p-n transistors 58 and 60 of the differential amplifier stage 42 being thus turned on, a collector current $I_b$ flows through the current path of each of the n-p-n transistors 58 and 60. Each of the n-p-n transistor 66 of the differential amplifier stage 42 and the p-n-p transistor 78 of the output stage 44 is accordingly turned on. Across the resistor 64 is now produced a voltage drop $RI_b$ so that the n-p-n transistor 74 of the output stage 44 is activated by the voltage $V_{CC}$-$RI_b$. Considering that the n-p-n transistor 74 forms part of an n-p-n transistor type emitter-follower network, there is a base-emitter voltage $V_{BE}$ produced between the base and emitter of the n-p-n transistor 74. The output signal $V_{OUT}$ to appear at the signal output terminal 52 is thus given by the equation:

$$V_{OUT} = V_{CC} - (RI_b + V_{BE2}) \qquad \text{Eq. 4}$$

Where the high-level supply voltage $V_{CC}$ of ground level is used and if the voltage drop $RI_b$ across the resistor 64 is selected at 0.8 volt and the base-emitter voltage $V_{BE2}$ of the n-p-n transistor 74 selected at 0.75 volt, the output signal $V_{OUT}$ which appears at the signal output terminal 52 of the emitter-coupled logic circuit becomes $-1.55$ volt. This value of the output signal $V_{OUT}$ corresponds to the low level $V_{IN(L)}$ of the input signal $V_{IN}$ supplied to the emitter-coupled logic circuit, which again means that the emitter-coupled logic circuit under consideration acts as a logic inverter circuit.

When the n-p-n transistor 74 of the output stage 44 is turned on to build up the output signal $V_{OUT}$ of the low level, the p-n-p transistor 78 of the output stage 44 is also turned on either by the collector voltage of the n-p-n transistor 58 or the collector voltage of the n-p-n transistor 60 of the differential amplifier stage 42. With the p-n-p transistor 78 thus turned on, the load capacitor 76 is enabled to receive charges at a significantly high rate from the emitter of the n-p-n transistor 74. The output signal $V_{OUT}$ at the signal output terminal 70 is thus decreased rapidly to the low level through the complementary push-pull circuit which consists of the n-p-n and p-n-p transistors 74 and 78.

It will be apparent that the first preferred embodiment constructed to implement a logic inverter circuit as above described can be readily modified into a logic NOR gate circuit through use of a parallel combination of a plurality of n-p-n transistors in substitution for the single n-p-n transistor 54 in the circuit arrangement of FIG. 2.

Second Preferred Embodiment

Figure 3:
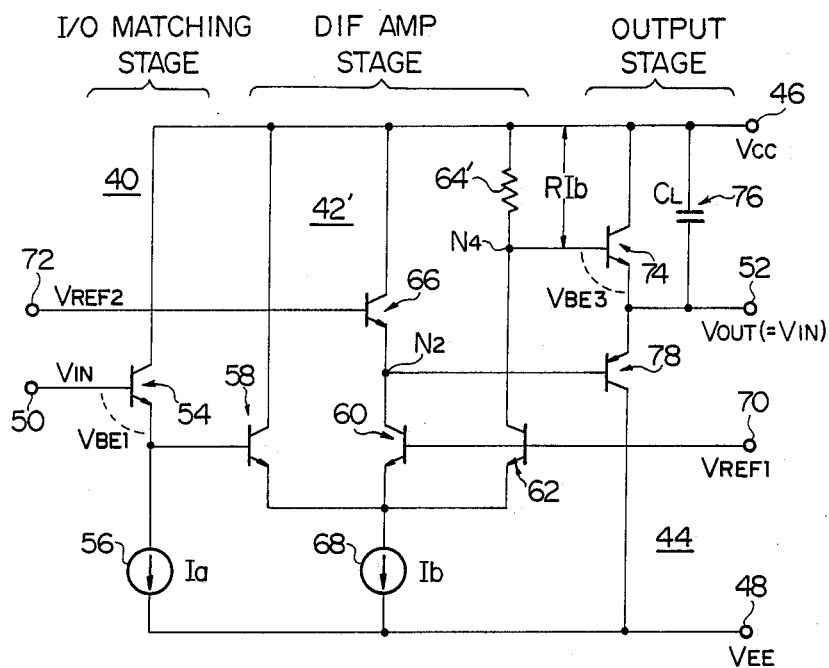

FIG. 3 shows a second preferred embodiment of an emitter-coupled logic circuit according to the present invention.

As illustrated in FIG. 3, the second preferred embodiment of the present invention is a simple modification of the embodiment hereinbefore described with reference to FIG. 2. Thus, the second preferred embodiment of the present invention also largely comprises an input stage 40, a differential amplifier stage 42' and an output stage 44 which are connected in parallel between high-level and low-level supply voltage sources 46 and 48 and in series between a signal input terminal 50 and a signal output terminal 52.

The emitter-coupled logic circuit herein shown is constructed to implement a buffer circuit. Thus, a binary output signal $V_{OUT}$ having a low level of $-1.55$ volt or a high level of $-0.75$ volt is to appear at the signal output terminal 52 in response to the binary input signal $V_{IN}$ of the low level $V_{IN(H)}$ of $-1.55$ volt or the high level $V_{IN(L)}$ of $-0.75$ volt, respectively.

In the emitter-coupled logic circuit forming the second preferred embodiment of the present invention, the input stage 40 and output stage 44 are per se similar to their respective counterparts in the embodiment of FIG. 2. Thus, the input stage 40 of the emitter-coupled logic circuit shown in comprises a series combination of an n-p-n transistor 54 and a constant current source network 56 and the output stage of the emitter-coupled logic circuit comprises an n-p-n transistor 74 and a load capacitor 76 which are connected in parallel to a p-n-p transistor 78.

On the other hand, the differential amplifier stage 42' of the emitter-coupled logic circuit shown in FIG. 3 comprises n-p-n transistors 58, 60 and 62. The n-p-n transistor 58 has its collector connected directly to the bus line leading from the high-level supply voltage source 46. The n-p-n transistor 60 has its collector connected through an n-p-n transistor 66 to the bus line leading from the high-level supply voltage source 46. The n-p-n transistor 62 has its collector connected through a resistor 64' to the bus line leading from the high-level supply voltage source 46. The n-p-n transistors 58, 60 and 62 have their respective emitters connected in parallel through a constant current source network 68 to the bus line leading from the low-level supply voltage source 48. The constant current source network 68 is adapted to produce a constant current $I_b$ through the n-p-n transistor 58, through the series combination of the n-p-n transistors 60 and 66, or through the series circuit composed of the n-p-n transistor 62 and the resistor 64'.

Each of the n-p-n transistors 58 and 60 has its base connected to the emitter of the n-p-n transistor 54. The n-p-n transistor 62 has its base connected to a first reference voltage source 70 which per se is similar to its counterpart in the embodiment of FIG. 2. The n-p-n transistor 66 has its base connected to a second reference voltage source 70 which per se is also similar to its counterpart in the embodiment of FIG. 2.

As in the embodiment of FIG. 2, the n-p-n transistor 74 forming part of the output stage 44 has its collector connected directly to the high-level supply voltage source 46 and its emitter connected to the the low-level supply voltage source 48 through the p-n-p transistor 78. The emitter of the n-p-n transistor 74 is further connected to the signal output terminal 52 of the emitter-coupled logic circuit. The load capacitor 76 has one of its plates connected to the collector of the n-p-n transistor 74 and the other plate connected to the emitter of the transistor 74 as shown. The combination of the n-p-n transistor 74 and load capacitor 76 thus connected between the bus line leading from the high-level supply voltage source 46 and the bus line leading from the low-level supply voltage source 48 forms an n-p-n transistor type emitter-follower network in the emitter-coupled logic circuit herein shown.

In the output stage 44 of the emitter-coupled logic circuit shown in FIG. 3, the n-p-n transistor 74 has its base connected to a node $N_3$ between the resistor 64' and the collector of the n-p-n transistor 62 of the differential amplifier stage 42'. Thus, the n-p-n transistor type emitter-follower network implemented by the combination of the n-p-n transistor 74 and the load capacitor 76 has an input terminal connected to the node $N_3$ between the resistor 64' and the collector of the n-p-n transistor 62 of the differential amplifier stage 42'. The n-p-n transistor 74 is activated by the voltage $V_{CC}\text{-}RI_b$ when the transistor 58 is turned on, wherein R is the resistance value of the resistor 64' and thus the value $V_{CC}\text{-}RI_b$ is indicative of the voltage drop across the resistor 64'.

The p-n-p transistor 78 provided in combination with the n-p-n transistor 74 forms a complementary push-pull circuit and has its emitter connected to the emitter of the n-p-n transistor 74 and to the output signal $V_{OUT}$ and its collector connected to the bus line leading from the low-level supply voltage source 48. The p-n-p transistor 78 having the collector thus connected to the low-level supply voltage source 48 forms a p-n-p transistor type emitter-follower network in the shown emitter-coupled logic circuit The p-n-p transistor 78 further has its base connected to a node $N_2$ between the collector of the n-p-n transistor 60 and the emitter of the n-p-n transistor 66 of the differential amplifier stage 42. Thus, the p-n-p transistor type emitter-follower network implemented by the p-n-p transistor 78 has an input terminal connected to the node $N_2$ between the collector of the n-p-n transistor 60 and the emitter of the n-p-n transistor 66.

In operation, when there is an input signal $V_{IN}$ of low level at the signal input terminal 50 of the emitter-coupled logic circuit, the n-p-n transistor 54 is turned off. Each of the n-p-n transistors 58 and 60 of the differential amplifier stage 42' is thus also turned off and the n-p-n transistor 62 of the differential amplifier stage 42' is activated to turn on by the first reference voltage $V_{REF1}$ from the first reference voltage source 70.

The n-p-n transistor 62 being turned on, there is little collector current $I_b$ flowing through each of the n-p-n transistors 58 and 60. In the absence of a collector current flowing through the n-p-n transistor 60, there is substantially no current allowed to flow through the n-p-n transistor 66 and accordingly the p-n-p transistor 78 remains in the de-activated state.

The n-p-n transistor 62 of the differential amplifier stage 42'being turned on, a collector current $I_b$ flows through the current path of the transistor 62 so that a voltage drop $RI_b$ is produced across the resistor 64 and accordingly the n-p-n transistor 74 of the output stage 44 is activated by the voltage $V_{CC}\text{-}RI_b$. A base-emitter voltage $V_{BE}$ is thus produced between the base and emitter of the n-p-n transistor 74 so that the output signal $V_{OUT}$ to appear at the signal output terminal 52 is given by the equation:

$$V_{OUT}=V_{CC}-(RI_b+V_{BE3}) \qquad \text{Eq. 5}$$

wherein $V_{BE3}$ represents the base-emitter voltage of the n-p-n transistor 74. This equation shows that the emitter-coupled logic circuit under consideration acts as a buffer circuit.

On the other hand, when there is an input signal $V_{IN}$ of high level appearing at the signal input terminal 50 of the emitter-coupled logic circuit, the n-p-n transistor 54 of the input stage 40 is activated to turn on. Each of the n-p-n transistors 58 and 60 of the differential amplifier stage 42' is also activated to turn on and the n-p-n transistor 62 of the stage 42' is turned off. The n-p-n transistors 58 and 60 of the differential amplifier stage 42' being thus turned on, a collector current $I_b$ flows through each of the n-p-n transistor 58 and 60 so that each of the n-p-n transistor 66 of the differential amplifier stage 42' and the p-n-p transistor 78 of the output stage 44 is turned on.

It therefore follows that the n-p-n transistor 74 forming part of the output stage 44 is activated by a voltage close to the high-level supply voltage $V_{CC}$ from the high-level supply voltage source 46. In this instance, the load capacitor 76 supplies charges to the emitter of the n-p-n transistor 74 so that the output signal $V_{OUT}$ at the signal output terminal 52 rapidly rises to a high level given by the equation:

$$V_{OUT} = V_{CC} - V_{BE2} \qquad \text{Eq. 6}$$

This equation also indicates that the emitter-coupled logic circuit under consideration acts as a buffer circuit.

It will be apparent that the second preferred embodiment of the present invention can also be readily modified into a logic OR gate circuit through use of a parallel combination of a plurality of n-p-n transistors in substitution for the single n-p-n transistor 54 in the circuit arrangement of FIG. 3.

What is claimed is:

1. An emitter-coupled logic circuit, comprising
   (a) a first bipolar transistor of a first type having its base electrically connected to a first input signal source ($V_{IN}$) and its collector electrically connected to a first supply voltage source network,
   (b) a second bipolar transistor of the first type having its base electrically connected to a second input signal source $V_{REF1}$) and its collector electrically connected to said first supply voltage source,
   (c) a constant current source network through which said first and second bipolar transistors have their respective emitters electrically connected in parallel to a second supply voltage source,
   (d) a first emitter-follower circuit having an input terminal electrically connected to the collector of said first bipolar transistor and its collector electrically connected to said first supply voltage source network, said bipolar transistor type emitter-follower circuit further having an output terminal,
   (e) a load element electrically connected between said first supply voltage source and the collector of one of said first bipolar transistor and said second bipolar transistor,
   (f) a third bipolar transistor of the first type having its base electrically connected to a reference voltage source and its collector electrically connected to said first supply voltage source,
   (g) a fourth bipolar transistor of the first type having its base electrically connected to the base of said first bipolar transistor, its collector electrically connected to the emitter of said third bipolar transistor and its emitter electrically connected in parallel with the the emitters of said first and second bipolar transistors to said second supply voltage source, and
   (h) a second emitter-follower circuit having an input terminal electrically connected a junction between the emitter of said third bipolar transistor and the collector of said fourth bipolar transistor, said second emitter-follower circuit further having an output terminal,
   (i) the output terminal of said first emitter-follower circuit and the output terminal of said second emitter-follower circuit being electrically connected together to provide an output terminal of the emitter-coupled logic circuit.

2. An emitter-coupled logic circuit as set forth in claim 1, in which said first emitter-follower circuit comprises a fifth bipolar transistor of the first type and a load capacitor which are electrically connected in parallel between said first supply voltage source and said bipolar transistor type emitter follower circuit, said fifth transistor having its collector electrically connected to said first supply voltage source and to one plate of said load capacitor, its emitter electrically connected to said second emitter follower circuit and to the other of said load capacitor, and its base electrically connected to the collector of said first bipolar transistor.

3. An emitter-coupled logic circuit as set forth in claim 2, in which said second emitter-follower circuit comprises a bipolar transistor having its collector electrically connected to said second supply voltage source, its emitter electrically connected to the emitter of said fifth bipolar transistor, and its base electrically connected to a node between the emitter of said third bipolar transistor and the collector of said fourth bipolar transistor.

4. An emitter-coupled logic circuit as set forth in claim 1, further comprising
   (j) an input/output matching emitter-follower network through which said first bipolar transistor is responsive to said first input signal source for providing matching between the input and output signals levels of the emitter-coupled logic circuit.

5. An emitter-coupled logic circuit as set forth in claim 4, said input/output matching emitter-follower network comprises a seventh bipolar transistor of the first type having its base electrically connected to said first input signal source its collector electrically connected to said first supply voltage source, and its emitter electrically connected through a constant current source network to said second supply voltage source.

6. An emitter-coupled logic circuit, comprising
   (a) a first n-p-n transistor having its base electrically connected to a first input signal source and its collector electrically connected to a first supply voltage source,
   (b) a second n-p-n transistor having its base electrically connected to a second input signal source and its collector electrically connected to said first supply voltage source,
   (c) a constant current source network through which said first and second n-p-n transistors have their respective emitters electrically connected in parallel to a second supply voltage source,
   (d) an n-p-n transistor type emitter-follower circuit having an input terminal electrically connected to the collector of said first n-p-n transistor and its collector electrically connected to said first supply voltage source, said n-p-n transistor type emitter-follower circuit further having an output terminal, (e) a load element electrically connected between said first supply voltage source and the collector of one of said first n-p-n transistor and said second n-p-n transistor, (f) a third n-p-n transistor having its base electrically connected to a reference voltage source and its collector electrically connected to said first supply voltage source, (g) a fourth n-p-n transistor having its base electrically connected to the base of said first n-p-n transistor, its collector electrically connected to the emitter of said third n-p-n transistor and its emitter electrically connected in parallel with the the emitters of said first and second n-p-n transistors to said second supply voltage source, and (h) a p-n-p transistor type emitter-follower circuit having an input terminal electrically connected a junction between the emitter of said third n-p-n transistor and the collector of said fourth n-p-n transistor, said p-n-p transistor type emitter-follower circuit further having an output terminal, (i) the output terminal of said n-p-n transistor type emitter-follower circuit and the output terminal of said p-n-p transistor type emitter-follower circuit being electrically connected together to provide an output terminal of the emitter-coupled logic circuit.

7. An emitter-coupled logic circuit as set forth in claim 6, in which said n-p-n transistor type emitter-follower circuit comprises a fifth n-p-n transistor and a load capacitor which are electrically connected in parallel between said first supply voltage source and said p-n-p transistor type emitter follower circuit, said fifth transistor having its collector electrically connected to said first supply voltage source and to one plate of said load capacitor, its emitter electrically connected to said p-n-p transistor type emitter follower circuit and to the other of said load capacitor, and its base electrically connected to the collector of said first n-p-n transistor.

8. An emitter-coupled logic circuit as set forth in claim 7, in which said p-n-p transistor type emitter-follower circuit comprises a p-n-p transistor having its collector electrically connected to said second supply voltage source, its emitter electrically connected to the emitter of said fifth n-p-n transistor, and its base electrically connected to a node between the emitter of said third n-p-n transistor and the collector of said fourth n-p-n transistor.

9. An emitter-coupled logic circuit as set forth in claim 6, further comprising (j) an input/output matching emitter-follower network through which said first n-p-n transistor is responsive to said first input signal source for providing matching between the input and output signals levels of the emitter-coupled logic circuit.

10. An emitter-coupled logic circuit as set forth in claim 9, said input/output matching emitter-follower network comprises a seventh n-p-n transistor having its base electrically connected to said first input signal source, its collector electrically connected to said first supply voltage source, and its emitter electrically connected through a constant current source network to said second supply voltage source.

11. An emitter-coupled logic circuit, comprising (a) a first n-p-n transistor having its base electrically connected to a first input signal source and its collector electrically connected to a first supply voltage source through a load element, (b) a second n-p-n transistor having its base electrically connected to a second input signal source and its collector electrically connected to said first supply voltage source, (c) a constant current source network through which said first and second n-p-n transistors have their respective emitters electrically connected in parallel to a second supply voltage source, (d) an n-p-n transistor type emitter-follower circuit having an input terminal electrically connected to a junction between said load element and the collector of said first n-p-n transistor and its collector electrically connected to said first supply voltage source, said n-p-n transistor type emitter-follower circuit further having an output terminal, (e) a third n-p-n transistor having its base electrically connected to a reference voltage source and its collector electrically connected to said first supply voltage source, (f) a fourth n-p-n transistor having its base electrically connected to the base of said first n-p-n transistor, its collector electrically connected to the emitter of said third n-p-n transistor and its emitter electrically connected in parallel with the the emitters of said first and second n-p-n transistors to said second supply voltage source, and (g) a p-n-p transistor type emitter-follower circuit having an input terminal electrically connected a junction between the emitter of said third n-p-n transistor and the collector of said fourth n-p-n transistor, said p-n-p transistor type emitter-follower circuit further having an output terminal, (h) the output terminal of said n-p-n transistor type emitter-follower circuit and the output terminal of said p-n-p transistor type emitter-follower circuit being electrically connected together to provide an output terminal of the emitter-coupled logic circuit.

12. An emitter-coupled logic circuit, comprising (a) a first n-p-n transistor having its base electrically connected to a first input signal source and its collector electrically connected to a first supply voltage source, (b) a second n-p-n transistor having its base electrically connected to a second input signal source and its collector electrically connected to said first supply voltage source through a load element, (c) a constant current source network through which said first and second n-p-n transistors have their respective emitters electrically connected in parallel to a second supply voltage source, (d) an n-p-n transistor type emitter-follower circuit having an input terminal electrically connected to a junction between said load element and the collector of said first n-p-n transistor and its collector electrically connected to said first supply voltage source, said n-p-n transistor type emitter-follower circuit further having an output terminal, (e) a third n-p-n transistor having its base electrically connected to a reference voltage source and its collector electrically connected to said first supply voltage source, (f) a fourth n-p-n transistor having its base electrically connected to the base of said first n-p-n transistor, its collector electrically connected to the emitter of said third n-p-n transistor and its emitter electrically connected in parallel with the the emitters of said first and second n-p-n transistors to said second supply voltage source, and (g) a p-n-p transistor type emitter-follower circuit having an input terminal electrically connected a junction between the emitter of said third n-p-n transistor and the collector of said fourth n-p-n transistor, said p-n-p transistor type emitter-follower circuit further having an output terminal, (h) the output terminal of said n-p-n transistor type emitter-follower circuit and the output terminal of said p-n-p transistor type emitter-follower circuit being electrically connected together to provide an output terminal of the emitter-coupled logic circuit.

13. An emitter-coupled logic circuit, comprising
(a) a first n-p-n transistor having its base electrically connected to an input signal source, its collector electrically connected to a first supply voltage source, and its emitter electrically connected to a second supply voltage source,
(b) a first constant current source network through which said first n-p-n transistor has its emitter electrically connected to said second supply voltage source,
(c) a second n-p-n transistor having its base electrically connected to the emitter of said first n-p-n transistor and its collector electrically connected to a first supply voltage source through a load element,
(d) a third n-p-n transistor having its base electrically connected to a first reference signal source and its collector electrically connected to said first supply voltage source,
(e) a fourth n-p-n transistor having its base electrically connected to a second reference voltage source and its collector electrically connected to said first supply voltage source,
(f) a fifth n-p-n transistor having its base electrically connected to the emitter of said first n-p-n transistor, its collector electrically connected to the emitter of said fourth n-p-n transistor and its emitter electrically connected to said second supply voltage source,
(g) a second constant current source network through which said second, third and fifth n-p-n transistors have their respective emitters electrically connected in parallel to said second supply voltage source,
(h) a sixth n-p-n transistor having its collector electrically connected to said first supply voltage source, its emitter providing a signal output terminal of the emitter-coupled logic circuit, and its base electrically connected to a junction between said load element and the collector of said second n-p-n transistor,
(i) a load capacitor electrically connected across the collector and emitter of said sixth n-p-n transistor, and
(j) a p-n-p transistor having its collector electrically connected to said second supply voltage source, its emitter electrically connected to the emitter of said sixth n-p-n transistor and providing said signal output terminal, and its base electrically connected to a node between the emitter of said fourth n-p-n transistor and the collector of said fifth n-p-n transistor.

14. An emitter-coupled logic circuit, comprising (a) a first n-p-n transistor having its base electrically connected to an input signal source, its collector electrically connected to a first supply voltage source, and its emitter electrically connected to a second supply voltage source,
(b) a first constant current source network through which said first n-p-n transistor has its emitter electrically connected to said second supply voltage source,
(c) a second n-p-n transistor having its base electrically connected to the emitter of said first n-p-n transistor and its collector electrically connected to a first supply voltage source,
(d) a third n-p-n transistor having its base electrically connected to a first reference signal source and its collector electrically connected to said first supply voltage source through a load element,
(e) a fourth n-p-n transistor having its base electrically connected to a second reference voltage source and its collector electrically connected to said first supply voltage source,
(f) a fifth n-p-n transistor having its base electrically connected to the emitter of said first n-p-n transistor, its collector electrically connected to the emitter of said fourth n-p-n transistor and its emitter electrically connected to said second supply voltage source,
(g) a second constant current source network through which said second, third and fifth n-p-n transistors have their respective emitters electrically connected in parallel to said second supply voltage source,
(h) a sixth n-p-n transistor having its collector electrically connected to said first supply voltage source, its emitter providing a signal output terminal of the emitter-coupled logic circuit, and its base electrically connected to a junction between said load element and the collector of said third n-p-n transistor,
(i) a load capacitor electrically connected across the collector and emitter of said sixth n-p-n transistor, and
(j) a p-n-p transistor having its collector electrically connected to said second supply voltage source, its emitter electrically connected to the emitter of said sixth n-p-n transistor and providing said signal output terminal, and its base electrically connected to a node between the emitter of said fourth n-p-n transistor and the collector of said fifth n-p-n transistor.

15. An emitter-coupled logic circuit, comprising
(a) a first bipolar transistor having a control terminal electrically connected to an input signal source, a current path electrically connected at one end thereof to a first supply voltage source and at the other end thereof to a second supply voltage source,
(b) a first constant current source network through which said first bipolar transistor has its current path electrically connected to said second supply voltage source,
(c) a second bipolar transistor of a first type having a control terminal electrically connected to the current path of said first bipolar transistor and a current path electrically connected to the first supply voltage source through a load element,
(d) a third bipolar transistor of the first type having a control terminal electrically connected to a first reference signal source and a current path electrically connected to said first supply voltage source, (e) a fourth bipolar transistor of the first type having a control terminal electrically connected to a second reference voltage source and a current path electrically connected at one end thereof to said first supply voltage source, (f) a fifth bipolar transistor of the first type having a control terminal electrically connected to the current path of said first bipolar transistor and a current path electrically connected at one end thereof to the other end of the current path of said fourth bipolar transistor and at the other end thereof to said second supply voltage source, (g) a second constant current source network through which said second, third and fifth bipolar transistors have their respective current paths electrically connected in parallel to said second supply voltage source, (h) a sixth bipolar transistor of the first type having a current path electrically connected at one end thereof to said first supply voltage source and a current path providing at one end thereof thereof a signal output terminal of the emitter-coupled logic circuit and electrically connected at the other end thereof to a junction between said load element and the current path of said second bipolar transistor, (i) a load capacitor electrically connected across the current path of said sixth bipolar transistor, and (j) a seventh bipolar transistor of a second type opposite to said first type, the seventh bipolar transistor having a current path electrically connected at one end thereof to said second supply voltage source and at the other end thereof to the current path of said sixth bipolar transistor and providing said signal output terminal, and a control terminal electrically connected to a node between the current path of said fourth bipolar transistor and the current path of said fifth bipolar transistor.

16. An emitter-coupled logic circuit, comprising (a) a first bipolar transistor having a control terminal electrically connected to an input signal source, a current path electrically connected at one end thereof to a first supply voltage source and at the other end thereof to a second supply voltage source, (b) a first constant current source network through which said first bipolar transistor has its current path electrically connected to said second supply voltage source, (c) a second bipolar transistor of a first type having a control terminal electrically connected to the current path of said first bipolar transistor and a current path electrically connected to the first supply voltage source, (d) a third bipolar transistor of the first type having a control terminal electrically connected to a first reference signal source, a current path electrically connected to said first supply voltage source through a load element, (e) a fourth bipolar transistor of the first type having a control terminal electrically connected to a second reference voltage source and a current path electrically connected at one end thereof to said first supply voltage source, (f) a fifth bipolar transistor of the first type having a control terminal electrically connected to the current path of said first bipolar transistor and a current path electrically connected at one end thereof to the other end of the current path of said fourth bipolar transistor and at the other end thereof to said second supply voltage source, (g) a second constant current source network through which said second, third and fifth bipolar transistors have their respective current paths electrically connected in parallel to said second supply voltage source, (h) a sixth bipolar transistor of the first type having a current path electrically connected at one end thereof to said first supply voltage source and a current path providing at one end thereof thereof a signal output terminal of the emitter-coupled logic circuit and electrically connected at the other end thereof to a junction between said load element and the current path of said third bipolar transistor, (i) a load capacitor electrically connected across the current path of said sixth bipolar transistor, and (j) a seventh bipolar transistor of a second type opposite to said first type, the seventh bipolar transistor having a current path electrically connected at one end thereof to said second supply voltage source and at the other end thereof to the current path of said sixth bipolar transistor and providing said signal output terminal, and a control terminal electrically connected to a node between the current path of said fourth bipolar transistor and the current path of said fifth bipolar transistor.

* * * * *